United States Patent
Roth et al.

(10) Patent No.: US 12,259,425 B2
(45) Date of Patent: Mar. 25, 2025

(54) CIRCUIT AND METHOD FOR CALIBRATING A PLURALITY OF AUTOMATED TEST EQUIPMENT CHANNELS

(71) Applicant: ADVANTEST CORPORATION, Tokyo (JP)

(72) Inventors: Bernhard Roth, Böblingen (DE); Georg-Hermann Reuer, Sindelfingen (DE); David Eskeldson, Colorado Springs, CO (US)

(73) Assignee: Advantest Corporation, Tokyo (JP)

( * ) Notice: Subject to any disclaimer, the term of this patent is extended or adjusted under 35 U.S.C. 154(b) by 133 days.

(21) Appl. No.: 17/992,398

(22) Filed: Nov. 22, 2022

(65) Prior Publication Data

US 2023/0091333 A1 Mar. 23, 2023

Related U.S. Application Data

(63) Continuation of application No. PCT/EP2021/061207, filed on Apr. 28, 2021.

(51) Int. Cl.
    *G01R 31/28* (2006.01)
    *G01R 35/00* (2006.01)

(52) U.S. Cl.
    CPC ....... *G01R 31/2834* (2013.01); *G01R 35/005* (2013.01)

(58) Field of Classification Search
    CPC .................. G01R 31/2834; G01R 35/005
    See application file for complete search history.

(56) References Cited

U.S. PATENT DOCUMENTS

| | | | |
|---|---|---|---|
| 2003/0086376 A1* | 5/2003 | Iorga | G01R 31/31926 370/241 |
| 2006/0082359 A1 | 4/2006 | Chow | |
| 2006/0236157 A1* | 10/2006 | Huang | G01R 31/3191 714/700 |
| 2008/0243740 A1 | 10/2008 | Hauptman | |

FOREIGN PATENT DOCUMENTS

| | | |
|---|---|---|
| CN | 107850642 A | 3/2018 |
| JP | H07-183346 A | 7/1995 |
| JP | 2008-534958 A | 8/2008 |
| JP | 2010-101771 A | 5/2010 |
| JP | 2010-523981 A | 7/2010 |
| JP | 2019-534447 A | 11/2019 |
| WO | 2005026759 A1 | 3/2005 |

* cited by examiner

*Primary Examiner* — Alesa Allgood

(57) ABSTRACT

A circuit for calibrating a plurality of automated test equipment channels comprises a central measurement unit configured to provide a current to one of the ATE channels and/or to measure a current from one of the ATE channels. The central measurement unit comprises a central measurement port, which is coupled with the plurality of ATE channels via respective diodes circuited between the central measurement port of the central measurement unit and respective DUT ports of the ATE channels.

19 Claims, 6 Drawing Sheets

CIRCUIT AND METHOD FOR CALIBRATING A PLURALITY OF AUTOMATED TEST EQUIPMENT CHANNELS

CROSS-REFERENCE TO RELATED APPLICATIONS

This is a continuation of PCT Patent Application No. PCT/EP2021/061207 filed Apr. 28, 2021, which is incorporated herein in its entirety.

TECHNICAL FIELD

Embodiments according to the invention are related to circuits for calibrating a plurality of automated test equipment channels. Further embodiments are related to methods for calibrating a plurality of automated test equipment channels. Generally speaking, embodiments according to the invention are related to improved current calibration for automated test equipment (ATE) channels.

BACKGROUND OF THE INVENTION

Over the past decades, integrated circuits are becoming more and more complex. Also, the pin count of integrated circuits has increased significantly. This imposes significant requirements on the testing of the integrated circuits in automated test equipment. In particular, in view of the complexity of the integrated circuits, and also in view of the target to keep test costs reasonably small, it is common to use automated test equipment (ATE) in order to test integrated circuits, both at the wafer level and after packaging. Furthermore, assembled printed circuit boards are also commonly tested using automated test equipment.

Automated test equipment typically provides predefined stimulus signals to the devices under test (DUTs)(e.g., integrated circuits or assembled printed circuit boards) and to also evaluate a response of the device under test to the provided signals. It is also common to perform both digital tests (like, for example, pattern tests) and analog tests, like a measurement of voltage-current characteristics of inputs and/or outputs of the device under test. For example, analog measurements may be used to verify the integrity of the input circuits and output circuits of the configured circuits, the proper functioning of protective diodes, and so on. Consequently, it is desirable to equip the automated test equipment with a capability to provide electrically well-defined stimulus signals and/or to precisely characterize DUT input and/or output signals of the DUT. Accordingly, pin electronics (PE) of an automated test equipment channel often comprises circuitry to provide a well-defined current and/or a well-defined voltage. Moreover, pin electronics of an automated test equipment channel often comprises circuitry to precisely measure a current and/or a voltage.

In order to have a good accuracy, it is often desirable or even necessary to calibrate the pin electronics. Referring to FIG. 6, a conventional calibration circuit according to the prior art is illustrated. The calibration circuit can include a pin electronic circuit for each device unit test. The pin electronic circuits can be coupled between a supply potential (VCC-VEE). Each respective pin electronic circuit can be coupled to a respective device under test by a respective automated test equipment channel. Optional protective diodes can be coupled between respective automated test equipment channels and the supply potentials for the respective pin electronic circuits. The respective automated test equipment channel coupled between the respective pin electronic circuit and the respective device under test can also be coupled to a central measurement unit by a respective switching element. It has been found that a calibration of the pin electronics often brings a high effort, both in terms of time and in terms of a required equipment and/or in terms of required circuitry. In view of this situation, there is a desire to create a concept which allows for a better tradeoff between accuracy, required time, and required circuit effort when calibrating a plurality of automated test equipment channels.

SUMMARY OF THE INVENTION

An embodiment according to invention creates a circuit for calibrating a plurality of automated test equipment (ATE) channels (e.g., comprising ATE pin electronics, ATE PE). The circuit comprises a central measurement unit (for example designated with CMU) configured to provide a current to one of the ATE channels (e.g., to a selected ATE channel, e.g., to an ATE channel which is activated while one or more other ATE channels are deactivated), and/or to measure a current from (e.g., provided by or enforced by) one of the ATE channels (e.g., a selected ATE channel, e.g., from an ATE channel which is activated while one or more other ATE channels are deactivated). Moreover, the central measurement unit comprises a central measurement port, which is coupled with the plurality of ATE channels using (e.g., via) respective diodes (for example, "upper" diodes connected to nodes DUT 1 to DUTn) circuited (or arranged) between the central measurement port and the central measurement unit (which is illustrated, for example, using a vertical line coupled directly or via a relay to the central measurement unit CMU) and respective DUT ports (e.g., ports of the automated test equipment pin electronics, also designated with ATE PE, where DUT1 to DUTn is connected) of the ATE channels.

This embodiment according to the invention may, for example, allow for an efficient calibration of a plurality of ATE channels. For example, the calibration may comprise a provision of a well-defined current from the central measurement unit to one of the ATE channels via a respective diode and the measurement of the provided current by a measurement unit of the considered ATE channel. By comparing the current provided by the central measurement unit to the selected channel via the respective diode with a measurement result of a measurement unit of the selected ATE channel, a correction factor (or, generally speaking, one or more correction values) may, for example, be determined to compensate for inaccuracies of the measurement unit of the ATE channel. It should be noted that in many cases, one correction value is not enough. For example, if linear (e.g., if a linear correction is performed), then an offset and gain value may, for example, be needed. As another example, if nonlinear (e.g., if a nonlinear correction is used) then a lookup table (having, for example, a plurality of parameters or entries) or formulas (comprising, for example, a plurality of parameters) can be used. For example, a high precision of the current provided by the central measurement unit may be achieved by using a high-quality current reference in the (e.g., centralized) central measurement unit, while measurement units of the individual ATE channels are typically less precise and not so well-controlled in their characteristics.

Alternatively, one of the ATE channels may be configured (e.g., programed) for providing a specified current, and this current may be routed to the central measurement unit via a respective diode. The central measurement unit may precisely measure the current provided by the selected ATE current via the diode, and an appropriate correction factor or calibration factor (or, generally, one or more correction values) may be determined on the basis of a comparison between the current value measured by the central measurement unit and the instrumented current.

This embodiment according to the invention is based on the idea that a coupling of the central measurement unit with the plurality of ATE channels via respective diodes eliminates the need to have a large number of spacious, costly and sometimes unreliable relays in-between the central measurement unit and the ATE channels, or to use another even more costly calibration mechanism. In particular, it has been found that the application of an appropriate bias allows to determine which ATE channel should be effectively coupled with the central measurement unit, i.e., which of the diodes should be conductive during a certain calibration step. Moreover, it has also been recognized that a possible voltage drop across the currently conductive diode can be tolerated for many calibration procedures, e.g., for a current calibration. In addition, it has been found that the diodes help to keep a parasitic capacitance reasonably small, e.g., when compared to a case in which switching transistors are coupled to the DUT port. When the diodes are reverse biased (e.g., during normal operation), a capacitive loading of the DUT ports is small.

To conclude, it has been found that the usage of diodes circuited between the central measurement port of the central measurement unit and the ATE channels significantly reduces an effort of precise calibration of the pin electronics and/or automatic test equipment channels.

According to an aspect, in the circuit for calibrating a plurality of ATE channels (e.g., ATE PE), an ATE channel comprises a function for providing and/or measuring a current. For example, one or more of the ATE channels may comprise a driver and/or a comparator and/or an active load and/or a parametric measurement unit (e.g., designated as PPMU or PMU).

It has been found that the concept to have diodes between central measurement ports of a central measurement unit and ATE channels is particularly well-suited for calibrating a current provision functionality of the ATE channels and/or for a calibration of a current measurement functionality of the ATE channels, since a voltage drop across the diodes typically does not (or not significantly) degrade a calibration result in such a case. Accordingly, the current providing functionality of an ATE channel may, for example, be calibrated using a precise current measurement functionality of the central measurement unit, wherein an appropriate biasing of the diodes may, for example, ensure that the current provided by the ATE channel to be calibrated (and only the current provided by the ATE channel to be calibrated) is forwarded to the central measurement unit, while diodes associated with other ATE channels are blocked or reverse biased. Similarly, a current measuring functionality of an ATE channel can be calibrated by selectively forwarding a current provided by the central measurement unit to a single ATE channel to be calibrated, which, in turn, can be achieved by an appropriate biasing of the diodes coupled between the central measurement port of the central measurement unit and the ATE channels.

Typically, the voltage drop across the diodes does not significantly degrade the calibration accuracy, and the blocking effects of the diodes associated with the channels that are not currently calibrated is typically sufficiently good.

In a preferred embodiment of the circuit for calibrating a plurality of ATE channels (e.g., ATE PE), one or more of the ATE channels comprise an active load (e.g., as a part of the ATE PE), wherein the active load is configured to provide a current force capability. Alternatively or in addition, one or more of the ATE channels comprise a parametric measurement unit (e.g., as a part of the ATE PE), wherein the parametric measurement unit (e.g., PMU or PPMU) is configured to provide a current force capability and/or a current measure capability. Regarding this issue, it should be noted that it is possible to have an ATE channel with an active load and no parametric measurement unit (PMU or PPMU) or no active load and a PMU with only current force or only current measure capability.

By providing current force capability and/or current measure capability, the characteristics of a semi-conductor device, or of a semi-conductor manufacturing process, can be determined. However, it has been found that the diodes which are circuited between the central measurement port of the CMU and the ATE channels are particularly helpful for calibration of an ATE channel which has an active load providing a current force capability, since such an active load can be efficiently calibrated without significant loss of accuracy using the diode-based connection with the CMU. For example, the current measurement capability of the CMU can be used to calibrate the active load of an ATE channel, or the current force capability of the CMU may be used to calibrate a current measurement capability of the ATE channel, wherein a voltage drop across the respective diode may be unproblematic.

As an additional remark, it should be noted that there may be an ATE channel with an active load and no PMU or no active load and a PMU with only current force or only current measure capability. In other words, it is not essential that an ATE channel comprises both an active load and a PMU. Rather, in some cases, it may, for example, be sufficient that an ATE channel only comprises either an active load or a PMU.

In a preferred embodiment, the circuit for calibrating a plurality of ATE channels (e.g., ATE PE) is configured to selectively couple (e.g., via a first connection network and a second connection network, when using an external (e.g., not on-chip), or additional, relay, or via a common connection network and, optionally, internal switches (e.g., on-chip switches) arranged within the ATE channels) the central measurement unit to respective DUT ports via respective diodes, which are adapted to allow for a current flow in a first current direction (e.g., from the CMU to the respective DUT port) or (alternatively) via respective diodes which are adapted to allow for a current flow in a second current direction (e.g., from the respective DUT port to the CMU).

By having respective diodes which allow for a current flow in a first current direction, or which allow for a current flow in a second direction, it can be achieved that only a single ATE channel is effectively coupled to the CMU, for example, by biasing diodes associated with non-selected ATE channels in a non-conductive state. Thus, a calibration of a single selected ATE channel can be performed without using separate relays associated with the different ATE channels.

In a preferred embodiment, the circuit for calibrating a plurality of ATE channels (ATE PE) comprises a first connection network (e.g., a common line with branches associated with the ATE channels) coupled with respective DUT ports of the ATE channels using respective diodes, which are adapted to allow for a current flow in a first current direction (e.g., from the respective DUT ports to the first connection network). Furthermore, the circuit also comprises a second connection network (e.g., a common line with branches associated with the ATE channels) coupled with respective DUT ports of the ATE channels using respective diodes which are adapted to allow for a current flow in a second current direction (which may, for example, be opposite to the first current direction) (e.g., from the respective connection network to the respective DUT port). For example, the second current direction is opposite to the first current direction.

By using a first connection network and a second connection network, it is possible to decide whether a current should flow from the central measurement unit CMU to the selected ATE channel, or from the selected ATE channel to the central measurement unit. For example, the diodes may be biased in such a manner that only a single diode, which is coupled between the first connection network and the ATE channels, for example a diode associated with a selected ATE channel, is forward biased (e.g., at a certain time), and that all diodes, which are coupled between the second connection network and the ATE channels are reversed-biased (at the certain time). Accordingly, a single selected ATE channel can be calibrated only using a current flow in the first current direction in this situation. On the other hand, if a calibration should be performed with the second current direction, all diodes coupled with the first connection network may be reversed biased, and a single diode coupled to the second connection network (e.g., a diode coupled between the second connection network and the selected DUT channel to be calibrated) may be forward-biased.

However, it should be noted that different biasing conditions may be required for diodes coupled to the first connection network and for the diodes coupled to the second connection network. Thus, by having two separate connection networks, it is possible to adjust the biasing of the diodes in a well-controlled manner, such that it is possible to choose a single "coupling diode", which is between one of the connection networks and the selected ATE channel to be calibrated, to be conductive while all other diodes coupling the ATE channels with the connection networks are reversed biased (or non-conductive). Consequently, the described structure allows to calibrate an individually selectable ATE channel using a desired (selectable) current direction.

In a preferred embodiment of the circuit for calibrating a plurality of ATE channels (e.g., ATE PE), the circuit comprises a switch (e.g., a relay or a FET, or any other type of switch) alternatively coupling the central measurement unit with the first connection network and the second connection network (e.g., in dependence on a direction of a current flow during calibration).

It has been found that the use of a single relay is efficient to couple the connection networks with the central measurement unit. In particular, the relay coupling is completely insensitive with respect the desired current direction, and the effort for using a relay is fully acceptable, since only a single central relay is required (rather than channel-individual relays).

In a preferred embodiment of the circuit for calibrating a plurality of ATE channels (ATE PE), the circuit comprises a common connection network. The circuit (e.g., the ATE channels) comprises respective switches configured to selectively couple the common connection network to respective DUT ports via respective diodes, which are adapted to allow for a current flow in a first current direction (e.g., from the respective DUT ports to the first connection network), e.g., in case that a calibration is performed in which a current flows in the first current direction, or via respective diodes, which are adapted to allow for a current flow in a second current direction (e.g., from the respective connection network to the respective DUT), e.g., in case that a calibration is performed in which a current flows in the second current direction.

It has been found that the use of switches, which may be on-chip switches, to couple the common connection network to respective DUT ports via different diodes (e.g., one for a first current direction and one for a second current direction) allows for an efficient implementation of the inventive concept. In particular, it has been found that the combination of switches and diodes, which are, for example, coupled between the common connection network and the DUT ports in series, allows for a well-controlled establishment of a current path between a selected DUT port and the central measurement unit. For example, the switches do not necessarily need to be switchable individually. Rather, it is, for example, sufficient that switches coupled to diodes having a first orientation (e.g., a current-flow direction from DUT ports to the common connection network) are activated jointly, and it is also sufficient that other switches associated with an opposite current flow direction (which are, for example, in a series with other diodes) are activated jointly. However, the usage of a common connection network reduces a wiring effort and may, for example, be particularly efficient if switches which are in a series with the respective diodes can be provided on a chip that implements one or more ATE channels. Moreover, the diodes may be in between the DUT ports and the switches, such that the switches are "isolated" or "separated" from the DUT ports by the diodes in between, which may help to reduce the capacitive loading. Furthermore, the circuit may, for example, be adapted such that diodes associated with opened switches are reverse biased.

In a preferred embodiment of the circuit for calibrating a plurality of ATE channels (e.g., an ATE PE), the circuit is configured to operate the ATE channels in a calibration mode, such that only one of the diodes (e.g., "upper" diodes connected to nodes DUT1 to DUT n) circuited (arranged) between the central measurement port of the central measurement unit (e.g., illustrated by a vertical line coupled directly or via a relay to the central measurement unit) and the respective DUT ports (e.g., ports of ATE PE where DUT1 to DUT n is connected) of the ATE channels is forward-biased during a calibration of an (e.g., selected) ATE channel (e.g., by setting one or more ATE channels which are not currently calibrated into a high impedance state and/or by setting one or more ATE channels which are not currently calibrated into a state in which the respective diodes are reversed-biased).

By forward biasing only a single diode at a given instance in time, a single ATE channel can be selective coupled to the central measurement unit, which allows for a calibration of the selected channel. For example, an appropriate biasing of the diodes can be obtained by an appropriate setting of voltages provided by the different ATE channels. Moreover, the one or more connection networks which connect the central measurement port with the ATE channels can also be set to an appropriate bias voltage that results in the forward biasing (or "activation") of a single diode, such that only a single ATE channel is effectively coupled with the central measurement unit. Moreover, it should be noted that an appropriate setting of the ATE channels can typically be achieved in a very simple manner, since the ATE channels are typically programmable within a wide range of output voltages in a highly efficient and fast manner.

In a preferred embodiment of the circuit for calibrating a plurality of ATE channels (e.g., ATE PE), a further diode is coupled between a positive supply voltage port (e.g., VCC), and/or a negative supply voltage port (e.g., VCC) and the central measurement port. By having such an additional diode, an over voltage protection (or an under-voltage protection) of the ATE channel can be maintained under all circumstances, also during calibration.

In a preferred embodiment of the circuit for calibrating a plurality of ATE channels (e.g., ATE PE), the ATE channels comprise respective first series circuits of two or more diodes between the respective DUT port and the respective positive supply rail (e.g., VCC), to divert an over voltage from the DUT port. In this case, the central measurement port is coupled to a tap between the diodes of the first series connection. Alternatively or in addition, the ATE channels comprise respective second series circuits of two or more diodes between the respective DUT port and the respective negative supply rail (e.g., VEE), to divert an under voltage from the DUT port. In this case, the central measurement port is coupled to a tap between the diodes of the second series connection.

However, it should be noted that the usage of a tap between diodes of the first series connection and/or a tap between the diodes of the second series connection allows to double-use the over voltage protection diodes (e.g., of the first series connection) and/or the under-voltage protection diodes (e.g., of the second series connection) for the calibration of the ATE channels. Thus, the diodes of the first series connection may be well-suited for adjusting an allowable "over voltage" at the DUT port and at the same time allow for an efficient injection of a current provided by the central measurement unit to the ATE channel (or a draining of a channel to the central measurement unit).

In a preferred embodiment of the circuit for calibrating a plurality of ATE channels, the ATE channels comprise respective switches configured to selectively short-circuit one or more diodes of the first series connection which are between the tap of the first series connection and the positive supply rail. Alternatively or in addition, the ATE channels comprise respective switches configured to selectively short-circuit one or more diodes of the second series connection which are between the tap of the second series connection and the negative supply rail.

Using such a construction, an over voltage tolerance of the ATE channels and/or an under-voltage tolerance of the ATE channels can be adjusted. In other words, it can be adjusted by how much a voltage at the DUT port may be larger than a positive supply voltage, (e.g., VCC) and/or by how much a voltage at the DUT port may be smaller than a negative supply voltage (e.g., VEE). Furthermore, such a construction allows that there is an over voltage protection and/or an under-voltage protection even during calibration, which provides for a high degree of reliability.

In a preferred embodiment of the circuit for calibrating a plurality of ATE channels (e.g., ATE PE), the circuit is configured to selectively close the respective switches, to short-circuit one or more diodes of the first series connection which are between the tap of the first series connection and the positive supply rail, in a normal mode of operation (in which no calibration is performed), for example while leaving the switches open in a calibration mode. Alternatively or in addition, the circuit is configured to selectively close the respective switches, to short-circuit one or more diodes of the second series connection which are between the tap of the second series connection and the negative supply rail, in normal mode of operation (in which no calibration is performed), for example while leaving the switches open in a calibration mode.

By using such a concept, a capacitive loading of the DUT port can be reduced. Moreover, the one or more connection networks can be efficiently tied to a predetermined potential (e.g., to VCC or VEE) using such a concept (e.g., when operating in normal operation), which avoids an undesired cross cropping between different DUT ports under normal operation conditions in a very efficient manner. Furthermore, a reliable over voltage protection is provided at the same time. Thus, the concept brings along a particularly efficient implementation that comprises numerous advantages.

In a preferred embodiment of the circuit for calibrating a plurality of ATE channels (e.g., ATE PE), the circuit is configured to open the respective switches configured to selectively short-circuit one or more diodes of the first series connection which are between the tap of the first series connection and the positive supply rail, and/or the respective switches configured to selectively short-circuit one or more diodes of the second series connection which are between the tap of the second series connection and the negative supply rail during calibration. By selectively opening the respective switches, which can short circuit one or more diodes of the first series connection and/or one or more diodes of the second series connection under normal operation conditions, when operating in a calibration mode, the one or more connection networks are separated from the positive and/or negative supply potentials, such that a reasonable calibration operation is possible. Also, an overvoltage protection functionality and/or an under-voltage protection functionality is at the same time provided by the diodes which are no longer short circuited in the calibration mode.

In a preferred embodiment of the circuit for calibrating a plurality of ATE channels (e.g., ATE PE), the CMU is configured to implement a floating termination (e.g., of precision resistors) via a digital-to-analog converter.

Using such a floating termination, a potential on the connection network can be adjusted as desired, for example, by an appropriate setting of the output voltage of the digital-to-analog converter. Accordingly, an appropriate biasing of the above-mentioned diodes can be achieved (for example, in combination with a proper setting of output voltages of the ATE channels). Moreover, by varying the output voltage of the digital-to-analog converter, it could also be verified whether an ATE channel provides a desired current for different voltages, or a current-over-voltage characteristic of an ATE channel could be determined. Similarly, it could be verified whether a current sink functionality of an ATE channel works at different voltages.

Another embodiment according to the invention relates to a method for calibrating a plurality of ATE channels. The method comprises providing a current to one of the ATE channels (e.g., to a selected ATE channel, e.g., to an ATE channel which is activated while one or more other ATE channels are deactivated). Alternatively or in addition, the method comprises measuring a current from (e.g., provided by or enforced by) one of the ATE channels (e.g., a selected ATE channel, e.g., from an ATE channel which is activated while one or more other ATE channels are deactivated). In the method, a central measurement port is coupled with the plurality of ATE channels using (e.g., via) respective diodes (for example, upper diodes connected to nodes DUT 1 to DUT n) circuited (e.g., arranged) between the central measurement port (e.g., shown by a vertical line coupled directly or via a relay to the CMU) and respective DUT ports (e.g., ports of the ATE PE where DUT 1 to DUT n is connected) of the ATE channels, to perform the calibration.

This method is based on the same considerations as the above-described circuit. Moreover, it should be noted that the method may optionally be supplemented by any of the features, functionalities and details disclosed herein, both individually and taken in combination.

BRIEF DESCRIPTION OF THE FIGURES

Embodiments according to the present invention will subsequently be described with reference to the enclosed figures, in which.

DETAILED DESCRIPTION OF THE EMBODIMENTS

1. Circuit According to FIG. 1

Figure 1:
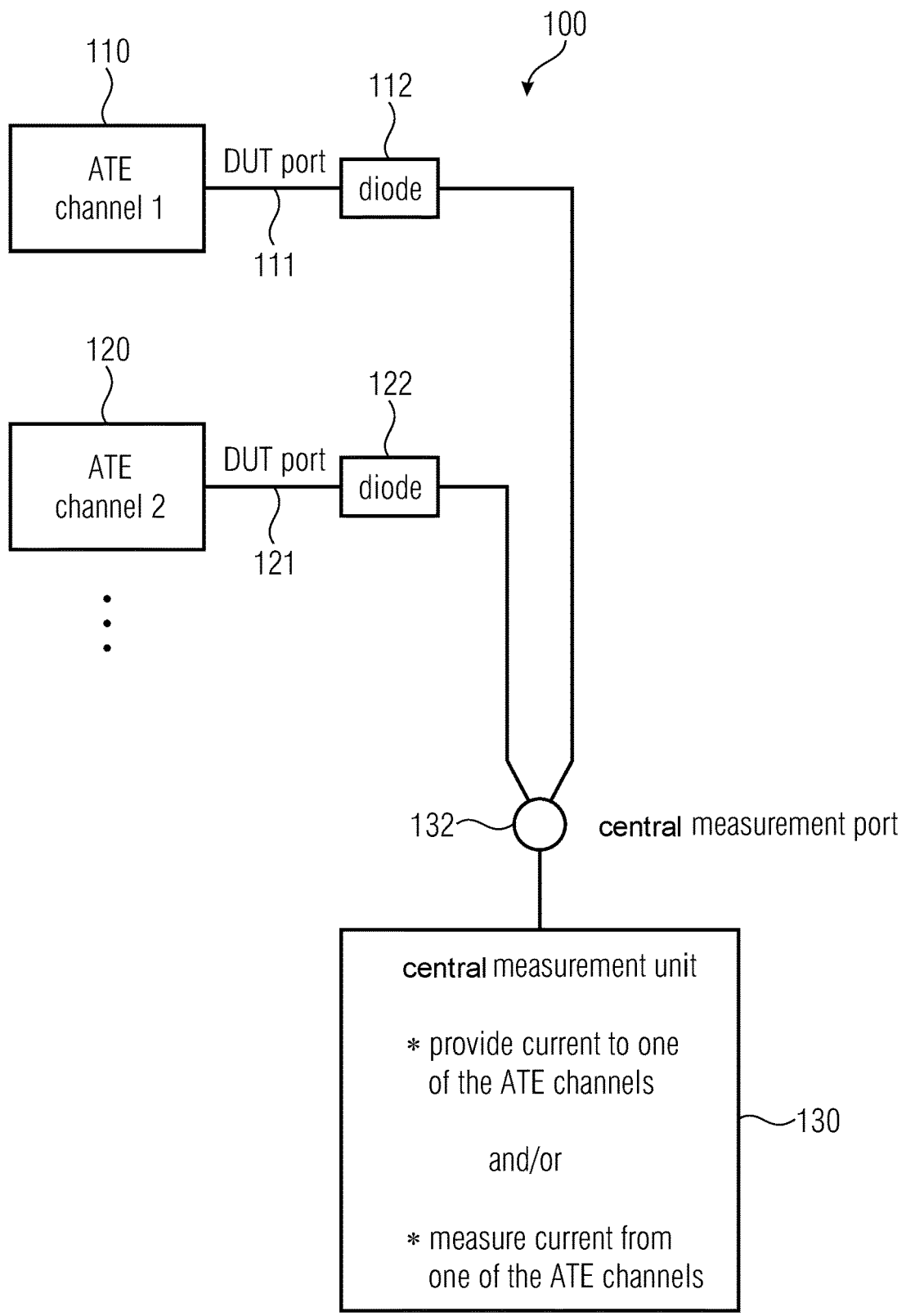
FIG. 1 shows a block schematic diagram of a circuit for calibrating a plurality of ATE channels, according to embodiments of the present invention.

FIG. 1 shows a block schematic diagram of a circuit for calibrating a plurality of ATE channels, according to embodiments of the present invention. The circuit 100 comprises a first ATE channel 110 and a second ATE channel 120. Although the circuit 100 is described with reference to two ATE channels 110, 120 for ease of explanation, it is appreciated that the circuit 100 can be extent to any number of ATE channels. The circuit further comprises a central measurement unit 130 which is configured to provide a current to a selected one of the ATE channels (e.g., to an ATE channel which is activated while one or more other ATE channels are deactivated). Alternatively or in addition, the central measurement unit is configured to measure a current from (e.g., provided by or enforced by) a selected one of the ATE channels (e.g., from an ATE channel which is activated while one or more other ATE channels are deactivated). Moreover, the central measurement unit comprise a central measurement port 132, which is coupled to the plurality of ATE channels 110, 120 by (e.g., via) respective diodes 112, 122, which are circuited (e.g., arranged) between the central measurement port 132 of the central measurement unit and respective DUT ports 111, 121 of the ATE channels 110, 120.

For example, a first diode 112 can be coupled between the DUT port 111 of the first ATE channel 110 and the central measurement port 132. Likewise, a second diode 122 can be coupled between the DUT port 121 of the second ATE channel 120 and the central measurement port. The first diode 112 and the second diode 122 can be arranged in the same orientation.

In a calibration mode, the central measurement unit 130 may be configured to provide a predetermined (e.g., precisely adjustable) current at its central measurement port 130. For this purpose, the central measurement unit 130 may, for example, comprise a precisely adjustable current source. Moreover, voltage levels of the ATE channels 110, 120 may be adjusted such that the first diode 112 is conductive (e.g., forward biased) while the second diode 122 is non-conductive (e.g., blocked or reversed-biased). Accordingly, by appropriately biasing the second diode 122, it may be ensured that no (or no significant) current is flowing through the second diode 122. Consequently, the current provided by the central measurement unit 130 flows into the first ATE channel 110 via the first diode 112. On the basis of the predetermined current provided by the central measurement unit through the first diode 112, a calibration of the first ATE channel 110 may be performed.

In a further calibration step, the biasing conditions may be exchanged, such that the second diode 122 is conductive while the first diode 112 is non-conductive (e.g., blocked or reversed biased). Consequently, the current provided by the central measurement unit 130 flows into the second ATE channel 121 via the second diode 122. On the basis of the predetermined current provided by the central measurement unit 130 through the second diode 122, a calibration of the second ATE channel may be performed.

Accordingly, it is apparent that by adjusting the biasing conditions of the diodes 112, 122, it can be determined which of the ATE channels 110, 120 is effectively coupled to the central measurement unit 130. Consequently, individual ones of the ATE channels 110, 120 can be calibrated.

In another calibration mode, a provision of a predetermined current by an ATE channel and a measurement of said current by the central measurement unit is also possible. For example, the first ATE channel 110 may be configured to provide a current and the second ATE channel 120 may be configured (e.g., programmed) such that the second diode 120 is in a non-conductive (e.g., blocking or reverse-biased) state. Thus, the current provided on the first ATE channel 110 may flow to the central measurement unit 130 via the first diode 112 and the central measurement port 132, and may be measured by the central measurement unit 130. Accordingly, a calibration may be performed on the basis of the measurement of the current. By appropriately biasing the second diode 122, it can be ensured that the current provided by the first ATE channel can be individually measured by the central measurement unit, even though the first ATE channel 110 and the second ATE channel 120 are both coupled to the central measurement port via diodes.

To conclude, it becomes apparent that an appropriate biasing of the diodes 112, 122, which are circuited between the ATE channels 110, 120 and the central measurement port, allows for effectively coupling a selected individual ATE channel 110, 120 to the central measurement unit, in order to perform a calibration of the ATE channel.

Moreover, it should be noted that the concept as described in FIG. 1 may optionally be extended to a larger number of ATE channels. Furthermore, it should be noted that the ATE channels 110, 120 may, for example, be part of an automated test equipment. The ATE channels may, for example, be adjustable or programmable under the control of a test program, which may be executed by a test program executor. Moreover, the ATE channels 110, 120 may, for example, be part of a channel module, which may be a module that comprises a plurality of ATE channels. However, an automated test equipment may comprise a very large number of ATE channels, e.g., of the order of hundreds or even thousands of ATE channels. The ATE channels 110, 120 may comprise different functionalities. For example, the ATE channels may comprise a programmable current source or a programmable active load. Alternatively or in addition, the ATE channels may comprise a measurement unit which may, for example, perform a current measurement.

For example, the measurement unit may be part of a "parametric measurement unit" which can measure characteristics of inputs and/or of outputs (e.g., generally speaking, of pins) of a device under test DUT. In particular, it should be noted that the DUT ports 111, 121 are typically adapted to be coupled to a device under test, or to a load board which comprises a DUT socket for contacting a device under test.

To conclude, the circuit 100 for calibrating a plurality of ATE channel is well-suited for usage in an automated test equipment and allows for a calibration of a plurality of ATE channels without using relays associated with the individual ATE channels.

Moreover, the circuit 100 may optionally by supplemented by any of the features, functionalities and details disclosed herein, both individually and taken in combination. Also, any of the features, functionalities and details described with respect to the circuit 100 may optionally be introduced into any other embodiments disclosed herein, both individually and taken in combination.

2. Circuit According to FIG. 2

Figure 2:
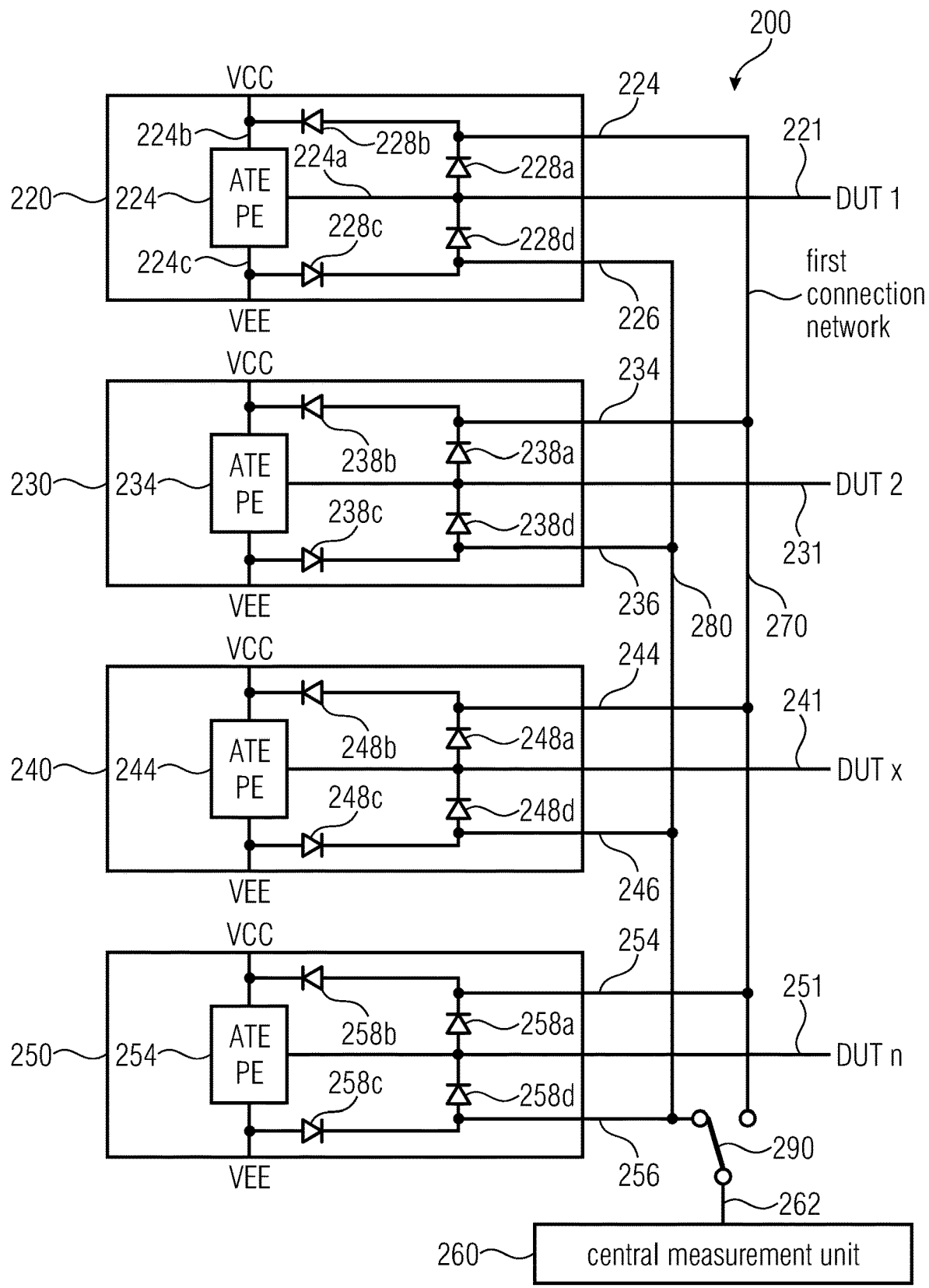
FIG. 2 shows a block schematic of a circuit for calibrating a plurality of ATE channels, according to embodiments of the present invention.

FIG. 2 shows a block schematic diagram of a circuit 200 for calibrating a plurality of ATE channels, according to embodiments of the present invention. The circuit 200 comprises a plurality of ATE channels 220, 230, 240, 250 and a central measurement unit 260. The circuit 200 also comprises a first connection network 270 and a second connection network 280.

The first ATE channel 220 comprises, for example, a DUT port 221, which is adapted to be coupled to a pin of a device under test. Moreover, the first ATE channel 220 comprises a first calibration connection 224 and a second calibration connection 226. The first calibration connection 224 is coupled to the first connection network, and the second calibration connection is coupled to the second connection network 280. Moreover, the first connection network 270 and the second connection network 280 are coupled to a central measurement port 262 of the central measurement unit 260 via a relay 290. For example, the relay 290 may couple the central measurement port 262 selectively to the first connection network 270 and to the second connection network 280.

In the following, details regarding the first ATE channel 220 will be described. However, it should be noted that the other ATE channels 230, 240, 250 may, for example, be identical to the first ATE channel 220.

The first ATE channel 220 comprises an ATE pin electronics (ATE PE) 224, a DUT connection 224a of which is coupled to the DUT port 221. Moreover, a positive supply connection 224b of the ATE pin electronics may be coupled to a positive supply voltage VCC, and a negative supply voltage connection 224c of the ATE pin electronics 224 may be coupled to a negative supply voltage VEE (which may, for example, be negative when compared to the first supply voltage VCC). The ATE channel 220 also comprises a first series connection of two diodes 228a, 228b, wherein an anode of the first diode 228a may be coupled to the DUT connection 224a, wherein a cathode of the first diode 228a may be coupled to an anode of the second diode 228b and wherein a cathode of the second diode 228b may be coupled to the positive supply voltage VCC. A node, which is coupled to the cathode of the first diode 228a and to the anode of the second diode 228b may, for example, also be coupled to the first connection network 270. Similarly, the first ATE channel 220 comprises a second series connection comprising a third diode 228c and a fourth diode 228d. An anode of the third diode 228c is coupled to the negative supply voltage VEE, and a cathode of the third diode 228c is coupled to an anode of the fourth diode 228d. A cathode of the fourth diode 228d is coupled to the DUT terminal 224a. Accordingly, it can be said that the first connection network is coupled to a tap of the first series connection of diodes 228a, 228b, and that the second connection network 280 is coupled to a tap of the second series connection of diodes 228c, 228d.

It should be noted that the second ATE channel 230, the third ATE channel 240 and the fourth ATE channel 250 may have a similar structure like the first ATE channel 220. In particular, it should be noted that the second ATE channel also comprises a first calibration connection 234 and a second calibration connection 236. The third ATE channel also comprises a first calibration connection 244 and a second calibration connection 246. Similarly, the fourth ATE channel 250 also comprises a first calibration connection 254 and a second calibration connection 256. It should be noted that the first calibration connections 224, 234, 244, 254 of the ATE channels 220, 230, 240 250 are all coupled to the first connection network 270. For example, the first calibration connections 224, 234, 244, 254 may all be directly coupled to the same conductive trace which forms the first connection network 270 (e.g., without any additional switches in between). Similarly, the second calibration connections 226, 236, 246, 256 of the different ATE channels may all be coupled to the same conductive structure that forms the second connection network 280. For example, the second calibration connections 226, 236, 246, 256 may all be directly coupled (e.g., without any switches in between) with the conductive structure or conductive strip forming the second connection network 280.

In the following, an example of the operation of the circuit 200 will be described.

In a first case (or setting), a current provided by a selected one of the ATE channels, for example, provided by the first ATE channel 220, is measured by the central measurement unit. For this purpose, the relay 290 is configured to connect the central measurement port 262 of the central measurement unit 260 with the first connection network 270. The selected ATE channel, in this case the first ATE channel 220, is configured to provide a desired current (e.g., set to a desired setting value). For this purpose, an output voltage of the first ATE channel 220 may be adjusted in such a manner that the first diode 228a becomes conductive. For this purpose, a potential which is present at the central measurement port 262 of the central measurement unit 260 is also adjusted to be such that the diode 228a is forward biased. At the same time, the diode 228b should be reversed biased. Furthermore, voltages at the DUT ports of the other, non-selected ATE channels are, for example, adjusted to be such that their respective diodes 238a, 248a, 258a are reversed bias. Accordingly, there is no current flow from the other, non-selected ATE channels 230, 240 250 to the first connection network 270. Rather, by an appropriate adjustment of the potentials, it can be ensured that only the diode 228a is forwarded biased, and that only the first ATE channel 220 provides a current to the first connection network 270. The current provided to the first connection network 270 by the first ATE channel 220 is then measured by a measurement unit of the central measurement unit 260.

Accordingly, it is apparent that an appropriate biasing of the diodes 228a, 238a, 248a, 258a, and also of the other diodes, allows to effectively only have a single ATE channel coupled with the central measurement unit 260 (in the above example, the first ATE channel 220). Thus, a measurement of the current provided by the selected ATE channel (e.g., the first ATE channel 220) is possible, which allows for a calibration of said ATE channel.

Naturally, it is possible to subsequently calibrate all ATE channels be changing the biasing conditions (e.g., such that the first diode 228a of the first ATE channel 220 is reversed biased (e.g., blocking) and one of the other first diodes 238a, 248a, 258a of one of the other ATE channels is forward biased (e.g., conducting).

In another case (or setting), the central measurement unit 260 provides a current, for example, using a precise and preferably adjustable current source. In this case, the central measurement port 262 of the central measurement unit 260 may, for example, be coupled to the second connection network 280. Moreover, the ATE pin electronics 224, 234, 244, 254 of the ATE channels 220, 230, 240, 250 may be set in such a manner that only for a selected one of the ATE channels, a diode 228d, 238d, 248d, 258d between the second connection network and the DUT port is conducting (e.g., forward-bias). For example, if the first ATE channel 220 is selected, the pin electronics 224 of the first ATE channel 220 is configured (or programmed) such that the diode 228d is conductive. For this purpose, a potential at the central measurement port 262 of the central measurement unit 260 is also set to a proper value, which allows for such a biasing of the diode 228d. In contrast, the pin electronics 234, 244, 254 of the other ATE channels (i.e., of the non-selected ATE channels) is set such that the diodes 238d, 248d, 258d between the second connection network 280 and the DUT ports 231, 241, 251 of the other ATE channels 230, 240, 250 is non-conductive (e.g., blocked or reversed-biased). Accordingly, the typically well-defined current provided by the central measurement unit 260 is forwarded, e.g., by the relay and the second connection network 280, to only a single, selected ATE channel via the (then forward-biased) diode 228d that is coupled between the second connection network and the DUT port 221 of the selected ATE channel 220. In contrast, a current flow from the second connection network towards the DUT connections 231, 241, 251 of the other ATE channels is prevented by the (then) reverse biased diodes 238d, 248d, 258d. Accordingly, the current provided by the central measurement unit 260 can be forwarded to a single selected ATE channel, which allows for a calibration of the selected ATE channel.

Naturally, it is possible to subsequently calibrate all ATE channels be changing the biasing conditions (e.g., such that the fourth diode 228d of the first ATE channel 220 is blocked and one of the other fourth diodes 238d, 248d, 258d of one of the other ATE channels is forward biased.

As an additional remark, it should be noted that the diodes 228b, 238b, 248b, 258b are typically non-conductive during calibration, but allow for an overvoltage protection.

Similarly, during normal operation, the first series connection of diodes 228a, 228b provides for an overvoltage protection at the DUT connection 221 (since overvoltages are limited to the sum of the forward voltages of diodes 228a, 228b).

The same also holds for the diodes coupled between the respective DUT ports and the respective negative supply voltage. For example, diodes 228c, 238c, 248c, 258c are normally non-conductive during the calibration, but provide for an under-voltage protection.

During normal operation the second series connection of diodes 228c, 228d also provides for an under-voltage protection at the DUT connection 221, since the voltage at the DUT connection 221 is typically limited to fall below the negative supply voltage VEE by no more than a sum of the forward voltages of diodes 228c, 228d.

To conclude, the circuit 200 allows for a calibration of an individual, selected ATE channel without having switches or relays associated with each individual ATE channel. Rather, there is only one switch or relay 290 which selectively connects the central measurement port 262 of the central measurement unit with the first connection network 270 or with the second connection network 280. A selection of an individual ATE channel for a calibration is done, for example, by properly adjusting operational states of all ATE channels that are coupled to the central measurement unit 260. For example, potentials at the central measurement port 262 of the central measurement unit 260 and at the DUT connections 221, 231, 241, 251 are set in such a manner that only one of the ATE channels is effectively coupled to a central measurement unit, thereby allowing a selective calibration of a selected ATE channel.

However, it should be noted that the circuit 200 may optionally be supplemented by any of the features, functionalities, and details disclosed herein, also with respect to the other embodiments, both individually and taken in combination. Moreover, it should be noted that any of the features, functionalities, and details of the circuit 200 may optionally be introduced in any of the other embodiments disclosed herein, both individually and taken in combination.

3. Circuit According to FIG. 3

Figure 3:
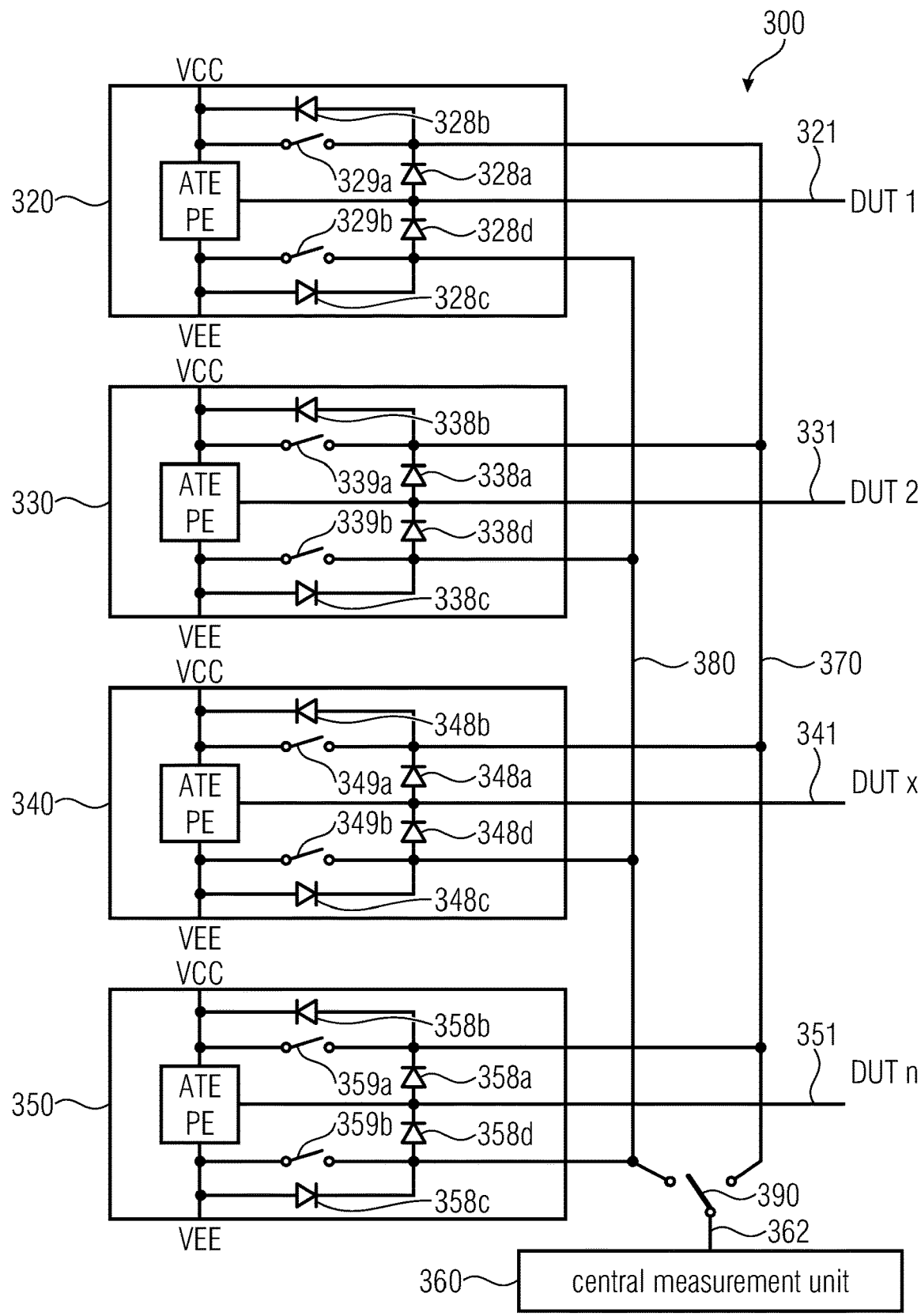
FIG. 3 shows a block schematic of a circuit for calibrating a plurality of ATE channels, according to embodiments of the present invention.

FIG. 3 shows a block schematic of a circuit 300 for calibrating a plurality of ATE channels, according to embodiments of the present invention. The circuit 300 comprises a plurality of ATE channels 320, 330, 340, 350. It should be noted that the circuit 300 is very similar to the circuit 200 according to FIG. 2. For example, the circuit can comprise a first ATE channel 320, which corresponds to the first ATE channel 220, second ATE channel 330 which corresponds to the ATE channel 230, a third ATE channel 340 which corresponds to the ATE channel 240 and a fourth ATE channel 350, which corresponds to the ATE channel 250. The circuit 300 also comprises a central measurement unit 360 which corresponds to the central measurement unit 260, a first connection network 370 which corresponds to the first connection network 270 and a second connection network 380 which corresponds to the second connection network 280. Moreover, the circuit 300 also comprises a relay 390 which corresponds to a relay 290.

Moreover, it should be noted that the ATE channels 320, 330, 340, 350 are very similar to the ATE channels 220, 230, 240, 250. For example, the first ATE channel 320 comprises a first series circuit of a first diode 328a and a second diode 328b. A tap between the first diode 328a and the second diode 328b is coupled (e.g., without any switch in between) with the first connection network 370. Moreover, the first ATE channel 320 also comprises a second series connection comprising a third diode 328c and a fourth diode 328d. A tap between the third diode 328c and the fourth diode 328d is coupled (e.g., without a switch in between) with the second connection network 380. Insofar, the first ATE channel 320 is similar to the first ATE channel 220, such that the above discussion also applies.

However, it should be noted that, in addition to the circuitry of the ATE channel 220, the ATE channel 320 further comprises a first switch 329a which is circuited in parallel to the second diode 328b, which allows to short circuit the second diode 328b. Moreover, the ATE channel 320 also comprises (in addition to the features of the ATE channel 220) a second switch 329b, which is circuited in parallel to the third diode 328c and which allows to short circuit the third diode 328c.

Similarly, the other ATE channels comprise switches 339a, 339b, 349a, 349b, 359a, 359b. It should be noted that, during calibration, the switches 329a, 329b, 339a, 339b, 349a, 349b, 359a, 359b are normally open (e.g., non-conductive). Accordingly, the switches 329a, 329b, 339a, 339b, 349a, 349b, 359a, 359b do not affect a calibration of the ATE channels. For example, at least those of the switches 329a, 329b, 339a, 339b, 349a, 349b, 359a, 359b coupled with the currently used connection network (e.g., out of the connection networks 370, 380) are open (non-conductive) when a calibration is performed. Accordingly, the respective non-short circuited diodes (out of the diodes 328b, 338b, 348b, 358b, 328c, 338c, 348c, 358c) serve as overvoltage protection or as undervoltage protection.

For example, those of the switches 329a, 329b, 339a, 339b, 349a, 349b, 359a, 359b which are coupled to the currently non-used connection network (out of the first connection network 370 and the second connection network 380) may optionally be closed (e.g., conductive) to tie the currently non-used connection network to a well-defined potential. However, this functionality may be considered as optional.

Accordingly, the switches 329a, 329b, 339a, 339b, 349a, 349b, 359a, 359b do not negatively affect a calibration and may even, optionally, help to tie a non-used connection network out of the connection networks 370, 380 to a predefined potential, which may help to reduce cross talk.

Moreover, when the automated test equipment is not in a calibration mode, switches 329a, 329b, 339a, 339b, 349a, 349b, 359a, 359b may, for example, be closed (e.g., conductive) to thereby short circuit the respective diodes. In this case, the connection networks 370, 380 are tied to well-defined potentials, which may help to avoid cross talk. Moreover, an improved overvoltage protection or undervoltage protection for the DUT connections 321, 331, 341, 351 may be provided, since there is only one diode (rather than a series connection of two diodes) between the respective DUT connection and the supply rails providing the positive supply voltage (e.g., VCC) and the negative supply voltage (e.g., VEE).

To conclude, the circuit 300 allows to perform an efficient calibration of the ATE channels. For the calibration, the same procedure as described above with respect to FIG. 2 can be used, wherein, during calibration, all switches 329a, 329b, 339a, 339b, 349a, 349b, 359a, 359b, or at least those switches which are coupled to the currently used connection network 380 or 390, are open. During normal operation, i.e., when the automated test equipment is testing a device under test, pins of which are coupled to the DUT connections 321, 331, 341, 351, the switches may, for example, be closed, thereby providing improved overvoltage protection and undervoltage protection while keeping a cross talk between different ATE channels small.

However, it should be noted that the circuit 300 according to FIG. 3 may optionally be supplemented by any of the features, functionalities and the details disclosed herein, also with respect to other embodiments, both individually and taken in combination. Moreover, it should be noted that any of the features, functionalities and details disclosed with respect to the circuit 300 may optionally be introduced in any of the other embodiments disclosed herein, both individually and taken in combination.

4. Circuit According to FIG. 4

Figure 4:
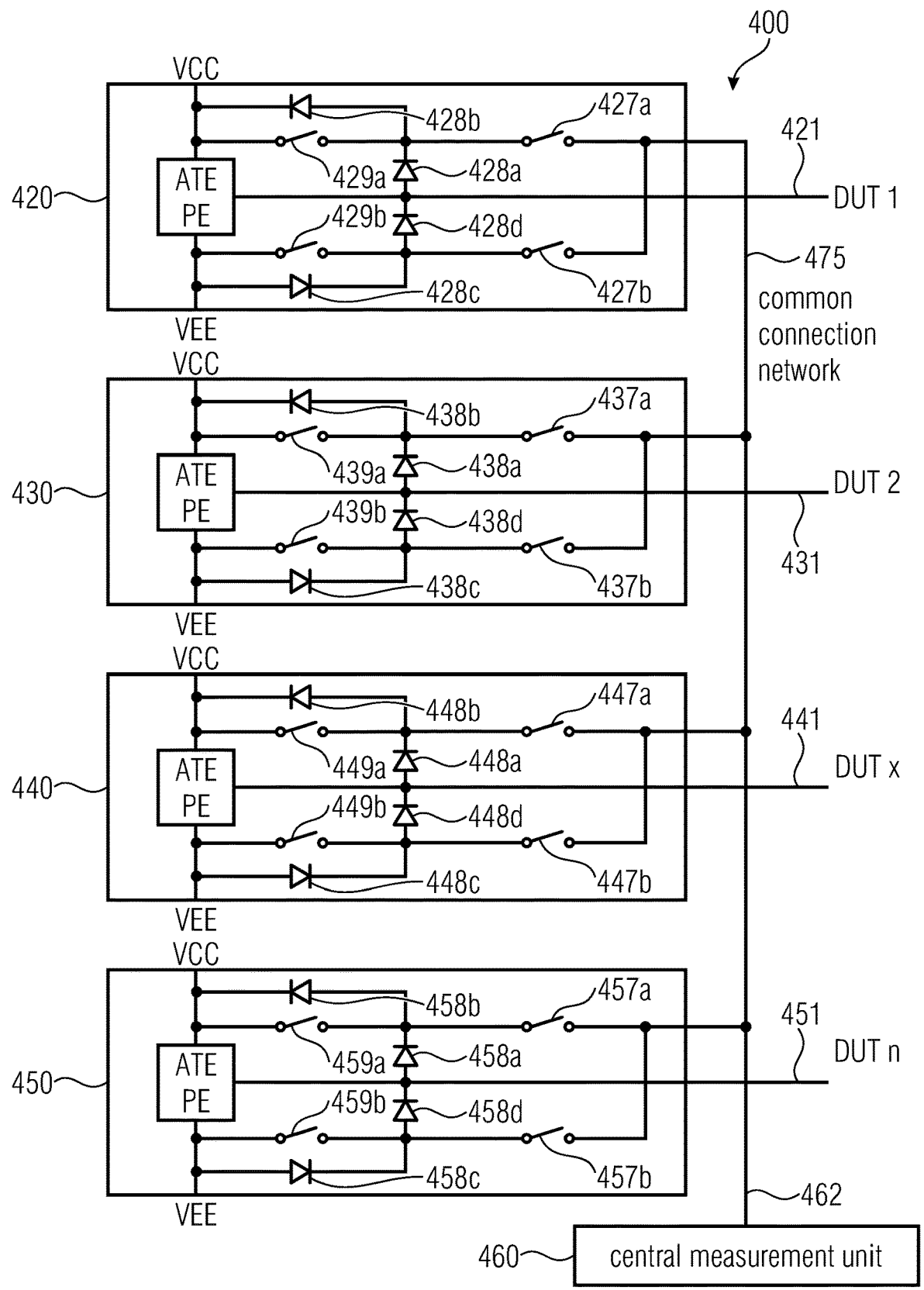
FIG. 4 shows a block schematic of a circuit for calibrating a plurality of ATE channels, according to embodiments of the present invention.

FIG. 4 shows a block schematic diagram of another circuit 400 for calibrating a plurality of ATE channels, according to embodiments of the present invention. The circuit 400 comprises a plurality of ATE channels 420, 430, 440, 450 and a central measurement unit 460. The circuit 400 comprises some similarities when compared to the circuits 200 and 300. For example, circuit 400 can comprise a first ATE channel 420, a second ATE channel 430, a third ATE channel 440 and a fourth ATE channel 450. Moreover, the circuit 400 comprises a central measurement unit 460. However, rather than having two connection networks 370, 380, circuit 400 only comprises a single connection network 475, which is coupled between a central measurement port 462 of the central measurement unit 460 and the ATE channels.

The first ATE channel 420 is somewhat different from the first ATE channel 220 and from the first ATE channel 320. In particular, the first ATE channel 420 comprises a series connection of a first diode 428a and of a second diode 428b. The series connection is similar to the series connection of diodes 328a and 328b, and also similar to the series connection of diodes 228a and 228b. Moreover, optionally, there is a switch 429a (first switch), which is circuited in parallel to the second diode 428b and which allows to short circuit the second diode 428b. Moreover, there is also a second series connection of a third diode 428c and of a fourth diode 428d and a switch 429b which allows to short circuit the third diode 428C.

The first series connection of diodes 428a, 428b is circuited between the DUT connection 421 and the positive supply voltage (or positive supply voltage rail) (e.g., positive supply voltage VCC). The second series connection of diodes 428c, 428d is circuited between the negative supply voltage or a negative supply voltage rail and the DUT connection 421. Orientations of the diodes can, for example, be seen in FIG. 4. Moreover, there is also, optionally, a second switch 429b, which is configured to selectively short circuit the third diode 428c. it should be noted that the series connection of diodes 428a, 428b corresponds to the series connection diodes 228a, 228b, and that the series connection of diodes 428c, 428d corresponds to the series connection of diodes 228c, 228d. Similarly, the series connection of diodes 428a, 428b corresponds to the series connection of diodes 328a, 328b, and the series connection of diodes 428c, 428d corresponds to the series connections of diodes 328c, 328d. Moreover, it should be noted that the switches 429a, 429b correspond to switches 329a, 329b. Thus, regarding the functionality of the series connections and regarding the functionality of the switches 329a, 329b, reference is made to the above description which also applies to the circuit 400.

However, the common connection network 475 is not directly connected to taps within the series connections of diodes. Rather, the common connection network 475 is coupled to a tap of the first series connection, e.g., between didoes 428a and 428b, via a first coupling switch 427a. Likewise, the common connection network is coupled to a tap of the second series connection, (e.g., between the third diode 428c and the fourth diode 428d) via a second coupling switch 427b. Accordingly, the common connection network 475 can selectively be coupled to the tap of the first series connection of diodes or to the tap of the second series connection of diodes.

Moreover, the structure of the other ATE channels 430, 440, 450 may be equal to the structure of the first ATE channel 420. For example, diodes 438a, 438b, 438c, 438d may correspond to diodes 428a, 428b, 428c, 428d. Similarly, diodes 448a, 448b, 448c, 448d may correspond to diodes 428a, 428b, 428c, 428d. Moreover, diodes 458a, 458b, 458c, 458d may correspond to diodes 428a, 428b, 428c, 428d. Moreover, switches 439a, 439b, corresponds to switches 429a, 429b, and switches 449a and 449b corresponds to switches 429a and 429b, and switches 459a and 459b correspond to switches 429a and 429b. Switches 437a, 437b correspond to switches 427a, 427b. Moreover, switches 447a, 447b correspond to switches 427a, 427b. Moreover, switches 457a, 457b correspond to switches 427a, 427b.

For example, the switches 427a, 427b, 437a, 437b, 447a, 447b, 457a, 457b may be part of the respective ATE channels, 420, 430, 440, 450. For example, the switches 427a, 427b, 437a, 437b, 447a, 447b, 457a, 457b may be integrated on chip switches which are integrated on one or more chips that are part of the ATE channels 420, 430, 440, 450, and said switches may, for example, be implemented using transistors like, for example, field effect transistors.

Moreover, it should be noted that the switches may, for example, decide which one of the ATE channels is coupled to the central measurement unit 460.

In an example, switches 427a, 437a, 447a, 457a may be switched together, for example, on the basis of a single common control signal. For example, when switches 427a, 437a, 447a, 457a are activated (e.g., in a conductive state), this may allow for a current flow from one of the ATE channels 420, 430, 440, 450 to the central measurement unit 460. In this case, the "other" switches 427b, 437b, 447b, 457b should be deactivated.

On the other hand, if the switches 427b, 437b, 447b, 457b are activated, this allows for a current flow from the central measurement unit 460 to a selected ATE channel (e.g., one of the ATE channels 420, 430, 440, 450). In this case, the "other" switches 427a, 437a, 447a, 457a should be deactivated.

For example, a decision regarding which of the ATE channels is the selected ATE channel may, for example, be determined based on the basis of the biasing conditions of the diodes. To select a single ATE channel as a selected ATE channel, which is to be calibrated, the biasing condition of the ATE channels and also the biasing condition provided on the common connection network 475 should be adjusted to have a single one of the diodes (for example, a single one of the diodes 428a, 438a, 448a, 458a) in a conductive state, while the other ones of said diodes should be in a non-conductive state. Alternatively, the biasing should be adjusted to bring a single one of the diodes 428d, 438d, 448d, 458d into a conductive state, while the other diodes are in a non-conductive state. Regarding an adjustment of the biasing, reference is made, for example, to the above description with respect to the circuits of FIGS. 2 and 3.

Alternatively, a setting of the coupling switches 427a, 427b, 437a, 437b, 447a, 447b, 457a, 457b may also be used to decide which one of the ATE channels is selected for a calibration. For example, only a single one or both of the coupling switches inside of one ATE channel may be activated, to thereby uniquely decide which of the ATE channels is selected for calibration.

To conclude, the circuit 400 according to FIG. 4 provides for different possibilities to select one of the ATE channels 420, 430, 440, 450 for a calibration. Both the coupling switches 427a, 427b, 437a, 437b, 447a, 447b, 457a, 457b and the diodes 428a, 428d, 438a, 438d, 448a, 448d, 458a, 458d can be used for selecting which one of the ATE channels should be calibrated, e.g., which one of the ATE channels should be effectively coupled to the central measurement port 462 of the central measurement unit 460.

Moreover, it should be noted that the circuit 400 according to FIG. 4 may optionally be supplemented by any of the features, functionalities and details described herein, both individually and taken in combination. Moreover, it should be noted that any of the features, functionalities and details of the circuit 400 may optionally be introduced into any of the other circuits disclosed herein, both individually and taken in combination.

5. Circuit According to FIG. 5

Figure 5:
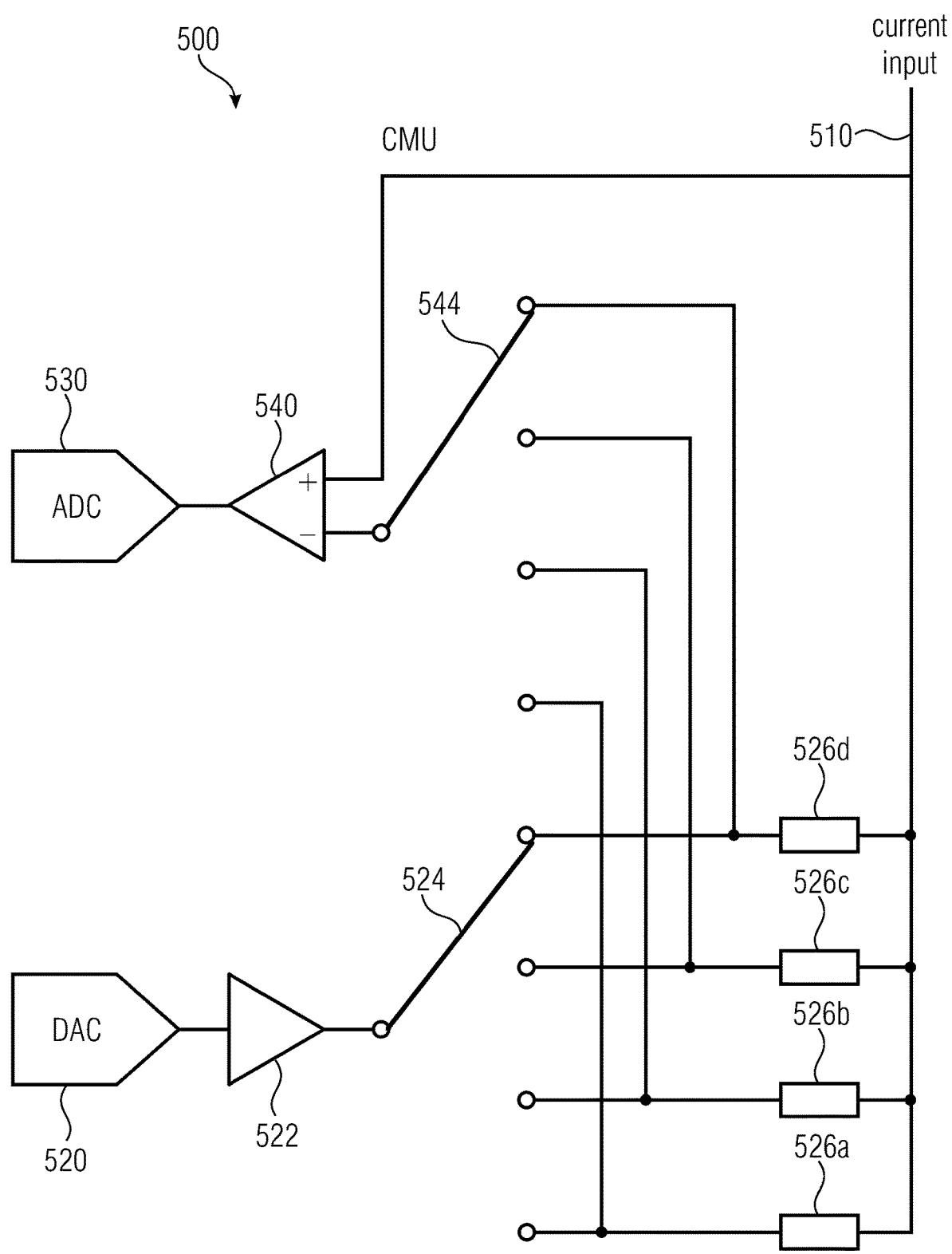
FIG. 5 shows a block schematic of a floating termination for usage in the circuits for calibrating a plurality of DUT channels, according to embodiments of the present invention.
Figure 6:
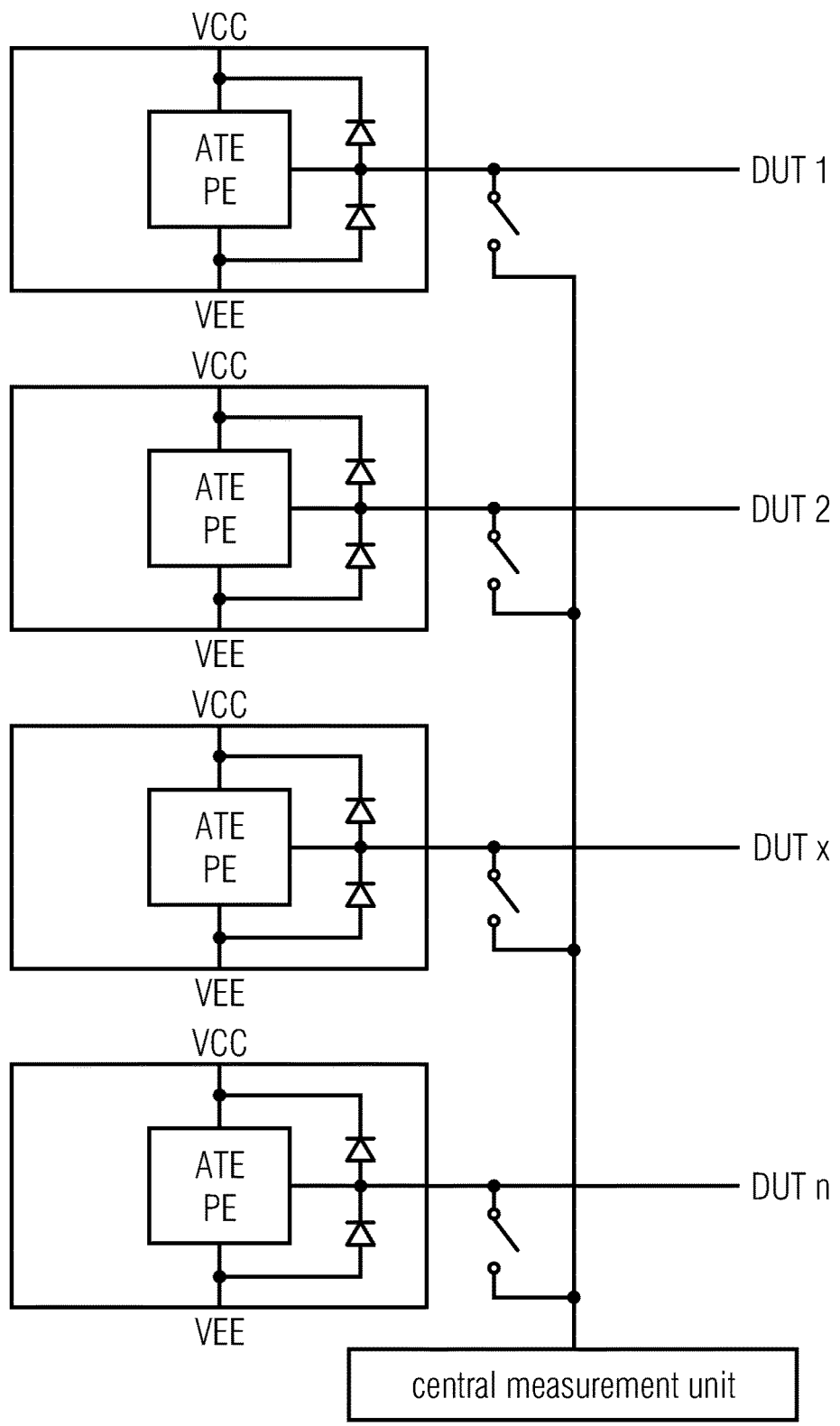
FIG. 6 shows a schematic of a conventional ATE circuit.

FIG. 5 shows a block schematic of a current measurement circuit, which can be used in the central measurement units 130, 260, 360, 460 disclosed herein, according to embodiments of the present invention. The current measurement circuit 500 comprises a current input 510 which may, for example, be coupled to the central measurement port 130, 262, 362, 462 described herein. The current measurement circuit may also comprise a voltage generator, a plurality of current measurement resistors, a bias switch, a voltage comparator and a measurement switch. The voltage generator can include a digital-to-analog converter 520, an output voltage of which may be programmable on the basis of a digital input information. The voltage generator may (optionally) comprise an associated output buffer 522, which may be configured to stabilize an output voltage provided by the digital-to-analog converter 520. An output of the buffer 522 may, for example, be coupled to the bias switch 524, which may be configured to couple the output of the buffer 522 to the plurality of current measurement resistors (e.g., shunt resistors) 526a, 526b, 526c, 526d. For example, the bias switch may be configured to selectively (or selectably) couple the output of the buffer 522 to a first terminal of a first current measurement resistor 526a or to a first terminal of a second current measurement resistor 526b. There may also be additional current measurement resistors, and the bias switch may also be configured to selectively couple the output of the buffer 522 to first terminals of said further current measurement resistors 526c, 526d. Second terminals of the current measurement resistors 526a, 526b, 526c, 526d may, for example, be coupled to the current input 510. Thus, the output of the buffer 522 may selectively (or selectably) be coupled to the current input 510 via one of the current measurement resistors 526a, 526b, 526c, 526d. Moreover, the voltage measurement unit can include an analog-to-digital converter 530, which is configured to measure a voltage drop across a currently selected current measurement resistor, which is, for example, selected by the bias switch 524. For this purpose, the current measurement circuit 500 may be configured to determine a voltage drop across the selected current measurement resistor. The voltage measurement unit may (optionally) include a differential amplifier 540 for sensing an analog voltage across the selected current measurement resistor. For example, a first input (e.g., a non-inverting input) of a differential amplifier 540 may be coupled to the current input 510, and a second input of the differential amplifier (for example, an inverting input) may be selectively coupled to a first terminal of the selected current measurement resistor. For example, a measurement switch 544 may be used to selectively couple the inverting input of the differential amplifier 540 to a first terminal of a selected current measurement resistor (e.g., out of the current measurement resistors 526a to 526d). Thus, the inverting input of differential amplifier 540 may, for example, be coupled to the first terminal of the same current measurement resistor which is currently coupled to the output of the buffer 522 via the bias switch 524. The bias and measurement switches 524 and 544 may, for example, be coordinated. Moreover, an output voltage provided by the differential amplifier 540 may, for example, be input into an analog-to-digital converter 530, which may therefore obtain an information about a voltage drop across the currently selected current measurement resistor.

To conclude, the current measurement circuit 500 may, for example, adjust a potential at the current input 510. For example, the potential at the current input 510 may be substantially identical to the potential at the output of the buffer 522, wherein it can be assumed that the voltage drop across the respective (currently selected) current measurement resistor 526a, 526b, 526c, 526d is comparatively small (since current measurement resistors are, for example, chosen to have a sufficiently small voltage drop across them). However, it should be noted that, in some embodiments, the voltage across a current measurement resistor should not be very small, because a small voltage usually results in a large noise. The normal voltage drop heavily depends on the real application. In this case of ATE calibration, for example, bigger voltages (e.g., 0.5V-1V) can be utilized.

Consequently, it is possible to adjust the potential (or voltage) at the current input 510 with good accuracy by providing an appropriate digital input information to the digital-to-analog converter 520. Moreover, the current flow through the current input 510 generates a voltage across the currently selected current measurement resistor, wherein the voltage drop is substantially proportional to the current. Accordingly, it is possible to adjust the potential (or a voltage) at the current input while accurately measuring the current flowing through the current input. Thus, the current measurement circuit 500 allows for the above-mentioned adjustment of the potential (or voltage) on the one or more connection networks (e.g., on the first connection network and on the second connection network, or on the common connection network). Consequently, the current measurement circuit can be utilized to apply an appropriate bias, which, in turn, puts one of the diodes into a forward bias (when used in combination with an appropriate setup of potentials provided at the DUT connections of the ATE channels). Therefore, the current measurement circuit 500 is well-usable in embodiments according to the present invention.

6. Conclusions and Further Embodiments

Embodiments according to the present invention advantageously provide for improved current calibration for ATE channels. Channel pin electronics (PE), also designated with ATE PE, normally are comprised of a driver, a comparator, an active load and a parametric measurement unit (PMU unit or PM unit). The latter two, for example, the active load and the parametric measurement unit, have current force capability, and the parametric measurement unit (PMU unit or PM unit) also has current measurement capability.

However, it should be noted that it is not necessary that an ATE channel has all of the above-mentioned functionalities. For example, it may be sufficient that an ATE channel comprises a comparator and a parametric measurement unit. In other cases, it may also be sufficient that an ATE channel comprises a driver and a parametric measurement unit. In other embodiments, it may also be sufficient that an ATE channel has an active load and a parametric measurement unit. In some specific samples, it may even be sufficient that an ATE channel comprises one of the above-mentioned components (driver, comparator, active load, parametric measurement unit).

In order to be able to calibrate the force and/or measure currents (for example, the currents forced by the driver and/or by the active load and/or by the parametric measurement unit and/or the current measured by the parametric measurement unit), a central measurement unit (CMU) with precise current measurement capabilities (and/or current sourcing capability and/or current sinking capability) accesses the channels. For example, in conventional solutions, this access is usually done via an individual relay per channel. However, it has been found that these relays consume precious board space limiting the number of channels on a given area. Also, it has been found that the relays (when open) have a significant capacitance which dramatically limits the frequency of the signals between the pin electronics and the device under test.

Embodiments according to the invention show an improved architecture where the individual relays can be avoided for current calibration.

In some embodiments according to the invention, just one relay and the central measurement unit (CMU) is used (or needed).

According to an aspect of the invention, the normally available ESD (electrostatic discharge) diode circuit is extended and, optionally, simple on-chip switches are added.

According to an aspect of the invention, two additional pads are needed per chip in some implementations. For example, if each of the ATE channels 220, 230, 240, 250 is implemented on an individual chip, two additional pins or pads are needed per chip, for example, for connecting to the first connection network and the second connection network.

In a normal operation, the switches (e.g., the switches 329a, 329b, 339a, 339b, 349a, 349b, 359a, 359b or the switches 429a, 429b, 439a, 439b, 449a, 449b, 459a, 459b) are closed. For example, in normal operation the switches are closed so that the diodes 328a,d serve as ESD-Diodes which is better than the series combination of 328a+b, 329c+d as ESD protection.

In calibration mode, (at least) the switches of the to-be-calibrated channel (e.g., at least one of the switches 329a, 329b, if the first ATE channel 320 to be calibrated) is opened.

In some embodiments, the relay at the central measurement unit (CMU) (e.g., the relay 290 or the relay 390) selects either one or the other line (e.g., either the first connection network 270 or the second connection network 280) depending on the sign (or current direction) of the to-be-calibrated current.

In some embodiments, a minor drawback is the fact that the voltage, at which the currents can be calibrated, is smaller (or larger, depending on the direction of the current) than in conventional solutions, due to the diodes' forward voltage. However, it has been found that this is not a serious problem in most cases.

Another embodiment according to the invention (e.g., as shown in FIG. 4) adds additional switches on the chip (e.g., switches 427a, 427b, 437a, 437b, 447a, 447b, 457a, 457b) so that only one pad (or pin) per chip is needed, and the relay at the central measurement unit (e.g., at the central measurement unit 460) can also be avoided.

Preferably, the additional on-chip switches (e.g., the switches 427a, 427b, 437a, 437b, 447a, 447b, 457a, 457b) may to be able to carry the maximum current.

According to an aspect, leakage currents may be minimized here because the number of diodes "sitting on the dc-cal bus" is very limited (wherein this cal bus, for example, effectively is node 475).

An appropriate CMU current measure implementation with floating termination of precision resistors (e.g., multiples, switched because of various current ranges) is also shown (for example, in FIG. 5). Floating termination, via a digital-to-analog converter (e.g., via the digital-to-analog converter 520) is used (or in some cases even needed) to correctly calibrate voltage-dependent ATE-PE currents with the analog-to-digital converter (e.g., the analog-to-digital converter 530).

As an additional remark, it should be noted that there are, for example, three options, e.g., as shown in FIGS. 2, 3 and 4. It has been found that an option without internal switches (e.g., as shown in FIG. 2) can also do the job. This can be the case if two diodes in series can effectively be used as for ESD protection. All three options are part of the invention.

Accordingly, embodiments according to the invention create a concept for an improved current calibration, which can be used in automated test equipment. For example, it is possible to reduce the costs of the LTE and to increase the pin count of the LTE using concepts disclosed herein.

The invention claimed is:

1. A circuit for calibrating ATE channels, the circuit comprising:
a plurality of automatic test equipment (ATE) channels;
a central measurement unit;
a plurality of diodes, wherein the central measurement unit is coupled to each of the plurality of ATE channels by a respective one of the plurality of diodes; and
wherein a selected one of the plurality of diodes is forward biased to provide a predetermined current from the central measurement unit to a respective selected one of the plurality of ATE channels, and wherein the other respective ones of the plurality of diodes are reverse biased to block the predetermined current to the other respective ones of the plurality of ATE channels in a first calibration mode;
wherein the plurality of diodes include:
respective series coupled first and second diodes coupled between respective ones of the plurality of ATE channels and a first supply voltage;
respective series coupled third and fourth diodes coupled between respective ones of the plurality of ATE channels and a second supply voltage; and
wherein further the central measurement unit is coupled to each of the plurality of ATE channels by the first diode of the respective series coupled first and second diodes and the third diode of the respective series coupled third and fourth diodes.

2. The circuit for calibrating ATE channels according to claim 1, wherein the selected one of the plurality of diodes is forward biased to couple a current on the respective selected one of the plurality of ATE channels to the central measurement unit for measurement by the central measurement unit and wherein the other respective ones of the plurality of diodes are reverse biased to block current on the other respective ones of the plurality of ATE channels from the central measurement unit in a second calibration mode.

3. The circuit for calibrating ATE channels according to claim 1, wherein the central measurement unit comprises:
a voltage generator configured to selectively generate one of a plurality of predetermined voltage levels;
a plurality of current measurement resistors having first terminals coupled to the selected one of the plurality of ATE channels;
a bias switch configured to selectively couple the voltage generator to a second terminal of a selected one of the plurality of current measurement resistors;
a voltage measurement unit; and
a measurement switch configured to selective couple the voltage measurement unit across the selected one of the plurality of current measurement resistors.

4. The circuit for calibrating ATE channels according to claim 1, further comprising a first switch for selectively coupling the central measurement unit to the first diode of the respective series coupled first and second diodes and the third diode of the respective series coupled third and fourth diodes of the respective ones of the plurality of ATE channels.

5. The circuit for calibrating ATE channels according to claim 4, further comprising:
respective second switches coupled in parallel with the second diode of the respective series coupled first and second diodes of each respective ones of the plurality of ATE channels; and
respective third switch coupled in parallel with the fourth diode of the respective series coupled third and fourth diodes of each respective ones of the plurality of ATE channels.

6. The circuit for calibrating ATE channels according to claim 1, further comprising:
respective series coupled first and second diodes coupled between respective ones of the plurality of ATE channels and a first supply voltage;
respective series coupled third and fourth diodes coupled between respective ones of the plurality of ATE channels and a second supply voltage;
a first common connection network coupling the central measurement unit to each of the plurality of ATE channels by the first diode of the respective series coupled first and second diodes; and
a second common connection network coupling the central measurement unit to each of the plurality of ATE channels by the third diode of the respective series coupled third and fourth diodes.

7. The circuit for calibrating ATE channels according to claim 6, further comprising a first switch for selectively coupling the central measurement unit to the first and second common connection networks.

8. The circuit for calibrating ATE channels according to claim 7, further comprising:
respective second switches coupled in parallel with the second diode of the respective series coupled first and second diodes of each respective ones of the plurality of ATE channels; and
respective third switch coupled in parallel with the fourth diode of the respective series coupled third and fourth diodes of each respective ones of the plurality of ATE channels.

9. The circuit for calibrating ATE channels according to claim 1, further comprising:
a common connection network coupled to the central measurement unit;
respective first switches coupling the common connection network to the first diode of the respective series coupled first and second diodes of the respective ones of the plurality of ATE channels; and
respective second switches coupling the central measurement unit to the third diode of the respective series coupled third and fourth diodes of the respective ones of the plurality of ATE channels.

10. The circuit for calibrating ATE channels according to claim 9, further comprising:
respective third switches coupled in parallel with the second diode of the respective series coupled first and second diodes of each respective ones of the plurality of ATE channels; and
respective fourth switch coupled in parallel with the fourth diode of the respective series coupled third and fourth diodes of each respective ones of the plurality of ATE channels.

11. A circuit for calibrating ATE channels, the circuit comprising:
a plurality of automatic test equipment (ATE) channels;
a central measurement unit;
a plurality of diodes, wherein the central measurement unit is coupled to each of the plurality of ATE channels by a respective one of the plurality of diodes; and
wherein a selected one of the plurality of diodes is forward biased to couple a current on a respective selected one of the plurality of ATE channels to the central measurement unit for measurement by the central measurement unit and other respective ones of the plurality of diodes are reverse biased to block current on other respective ones of the plurality of ATE channels from the central measurement unit in a calibration mode;
wherein the central measurement unit includes;
a voltage generator configured to selectively generate one of a plurality of predetermined voltage levels;
a plurality of current measurement resistors having first terminals coupled to the selected one of the plurality of ATE channels;
a bias switch configured to selectively couple the voltage generator to a second terminal of a selected one of the plurality of current measurement resistors;
a voltage measurement unit; and
a measurement switch configured to selective couple the voltage measurement unit across the selected one of the plurality of current measurement resistors.

12. The circuit for calibrating ATE channels according to claim 11, wherein the plurality of diodes comprise:
respective series coupled first and second diodes coupled between respective ones of the plurality of ATE channels and a first supply voltage;
respective series coupled third and fourth diodes coupled between respective ones of the plurality of ATE channels and a second supply voltage; and
wherein the central measurement unit is coupled to each of the plurality of ATE channels by the first diode of the respective series coupled first and second diodes and the third diode of the respective series coupled third and fourth diodes.

13. The circuit for calibrating ATE channels according to claim 12, further comprising a first switch for selectively coupling the central measurement unit to the first diode of the respective series coupled first and second diodes and the third diode of the respective series coupled third and fourth diodes of the respective ones of the plurality of ATE channels.

14. The circuit for calibrating ATE channels according to claim 13, further comprising:
respective second switches coupled in parallel with the second diode of the respective series coupled first and second diodes of each respective ones of the plurality of ATE channels; and
respective third switch coupled in parallel with the fourth diode of the respective series coupled third and fourth diodes of each respective ones of the plurality of ATE channels.

15. The circuit for calibrating ATE channels according to claim 12, further comprising:
respective series coupled first and second diodes coupled between respective ones of the plurality of ATE channels and a first supply voltage;
respective series coupled third and fourth diodes coupled between respective ones of the plurality of ATE channels and a second supply voltage;
a first common connection network coupling the central measurement unit to each of the plurality of ATE channels by the first diode of the respective series coupled first and second diodes; and
a second common connection network coupling the central measurement unit to each of the plurality of ATE channels by the third diode of the respective series coupled third and fourth diodes.

16. The circuit for calibrating ATE channels according to claim 15, further comprising a first switch for selectively coupling the central measurement unit to the first and second common connection networks.

17. The circuit for calibrating ATE channels according to claim 16, further comprising:
respective second switches coupled in parallel with the second diode of the respective series coupled first and second diodes of each respective ones of the plurality of ATE channels; and
respective third switch coupled in parallel with the fourth diode of the respective series coupled third and fourth diodes of each respective ones of the plurality of ATE channels.

18. The circuit for calibrating ATE channels according to claim 12, further comprising:
a common connection network coupled to the central measurement unit;
respective first switches coupling the common connection network to the first diode of the respective series coupled first and second diodes of the respective ones of the plurality of ATE channels; and
respective second switches coupling the central measurement unit to the third diode of the respective series coupled third and fourth diodes of the respective ones of the plurality of ATE channels.

19. The circuit for calibrating ATE channels according to claim 18, further comprising:
respective third switches coupled in parallel with the second diode of the respective series coupled first and second diodes of each respective ones of the plurality of ATE channels; and
respective fourth switches coupled in parallel with the fourth diode of the respective series coupled third and fourth diodes of each respective ones of the plurality of ATE channels.

* * * * *